United States Patent
Kokubun et al.

(10) Patent No.: US 9,171,629 B1
(45) Date of Patent: Oct. 27, 2015

(54) STORAGE DEVICE, MEMORY CONTROLLER AND MEMORY CONTROL METHOD

(71) Applicant: Kabushiki Kaisha Toshiba, Minato-ku (JP)

(72) Inventors: Naoaki Kokubun, Yokohama (JP); Osamu Torii, Setagaya (JP); Kohsuke Harada, Yokohama (JP); Riki Suzuki, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/478,292

(22) Filed: Sep. 5, 2014

Related U.S. Application Data (60) Provisional application No. 61/985,323, filed on Apr. 28, 2014.

(51) Int. Cl.
*G11C 11/34* (2006.01)
*G11C 16/10* (2006.01)

(52) U.S. Cl.
CPC ..................................... *G11C 16/10* (2013.01)

(58) Field of Classification Search
CPC . G11C 16/10; G11C 11/5628; G11C 11/5642
USPC ............. 365/185.24, 185.18, 185.29, 189.14, 365/189.15, 189.16
See application file for complete search history.

(56) References Cited

U.S. PATENT DOCUMENTS

| | | | |
|---|---|---|---|
| 7,006,380 B2 * | 2/2006 | Toda | 365/185.21 |
| 7,460,398 B1 * | 12/2008 | Roohparvar et al. | 365/185.03 |
| 8,024,545 B2 | 9/2011 | Kim et al. | |
| 8,310,876 B2 * | 11/2012 | Yoo et al. | 365/185.18 |
| 2012/0166716 A1 | 6/2012 | Schuette et al. | |

FOREIGN PATENT DOCUMENTS

JP 2001-229073 8/2001

OTHER PUBLICATIONS

U.S. Appl. No. 14/624,938, filed Feb. 18, 2015, Kokubun, et al.

* cited by examiner

*Primary Examiner* — Son Dinh
(74) *Attorney, Agent, or Firm* — Oblon, McClelland, Maier & Neustadt, L.L.P.

(57) ABSTRACT

According to one embodiment, a storage device comprises a nonvolatile memory and a memory controller that performs reading and writing data from and into the nonvolatile memory. A number, not being $2^n$, of threshold areas can be set in the memory cells of the nonvolatile memory. The memory controller performs first writing based on first data value assignment, which sets $2^n$ data values to correspond to $2^n$ threshold areas, in first-time writing into a first memory cell of the nonvolatile memory and performs second writing on the first memory cell after the first writing without erasing data based on second data value assignment, which sets $2^n$ data values to correspond to $2^n$ threshold areas including threshold areas not used in the first data value assignment.

16 Claims, 6 Drawing Sheets

STORAGE DEVICE, MEMORY CONTROLLER AND MEMORY CONTROL METHOD

CROSS-REFERENCE TO RELATED APPLICATIONS

This application is based upon and claims the benefit of priority from U.S. Provisional Application No. 61/985,323, filed on Apr. 28, 2014; the entire contents of which are incorporated herein by reference.

FIELD

Embodiments described herein relate generally to a storage device, memory controller and memory control method.

BACKGROUND

In a NAND flash memory (hereinafter referred to as a NAND memory), information is stored by means of the amounts of charge retained in the floating gates of memory cells. The threshold voltage is determined according to the amount of charge retained in the floating gate of the memory cell. The threshold voltage refers to a voltage at which the transistor of the memory cell becomes ON (current starts flowing). That is, when a voltage higher than or equal to the threshold voltage is applied to the memory cell, current flows, and when a voltage lower than the threshold voltage is applied, current does not flow. In the NAND memory, a plurality of threshold voltage ranges (areas) are defined with one data value being assigned to each area, and electrons are injected so that the threshold voltage of the memory cell is within the area corresponding to one of the data values. By this means, each memory cell can store a data value.

In conventional NAND memories, the number of threshold voltage areas of the memory cell that are distinguishable is a power of two. Hence, increasing the number of data values storable per memory cell from that of a memory cell capable of, e.g., three-bit storage per memory cell results in the use of a memory cell capable of four-bit storage. In this case, the number of areas increases greatly from 8 to 16.

DETAILED DESCRIPTION

In general, according to one embodiment, a storage device comprises a nonvolatile memory and a memory controller that performs reading and writing data from and into the nonvolatile memory. A number, not being $2^n$ (n is an integer equal to or greater than 1), of threshold areas can be set in the memory cells of the nonvolatile memory. The memory controller performs first writing based on first data value assignment, which sets $2^n$ data values to correspond to $2^n$ threshold areas, in first-time writing into a first memory cell of the nonvolatile memory and performs second writing on the first memory cell after the first writing without erasing data based on second data value assignment, which sets $2^m$ (m is an integer equal to or greater than 1) data values to correspond to $2^m$ threshold areas including threshold areas not used in the first data value assignment.

Exemplary embodiments of a memory controller, a storage devices, a memory controller and a memory control method will be explained below in detail with reference to the accompanying drawings. The present invention is not limited to these embodiments.

First Embodiment

Figure 1:
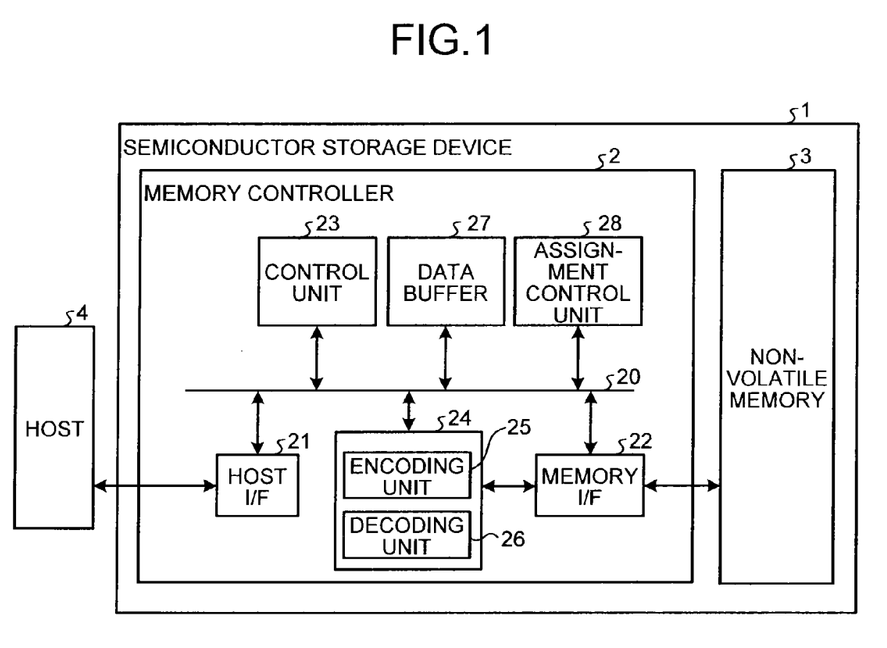
FIG. 1 is a block diagram showing an example configuration of a storage device according to a first embodiment.

FIG. 1 is a block diagram showing an example configuration of a storage device (semiconductor storage device) according to the first embodiment. The storage device 1 of the present embodiment comprises a memory controller 2 and a nonvolatile memory 3. The storage device 1 is connectable to a host 4. In FIG. 1, a state in which the semiconductor storage device 1 is connected to the host 4 is shown. The host 4 is, for example, an electronic device such as a personal computer or a mobile terminal.

The nonvolatile memory 3 is a semiconductor memory storing data in a nonvolatile manner and, for example, a NAND memory. In the NAND memory, in general, data is written and read out for each of write unit data called page. In the present embodiment, the memory cells of the nonvolatile memory 3 are memory cells of which the number of threshold areas is greater than two.

The memory controller 2 controls writing into the nonvolatile memory 3 according to a write command from the host 4. Further, the memory controller 2 controls reading from the nonvolatile memory 3 according to a read command from the host 4. The memory controller 2 comprises a host I/F 21, a memory I/F 22 (a memory control unit), a control unit 23, an ECC (Error Correcting Code) unit 24, a data buffer 27, and an assignment control unit 28, which are connected to each other via an internal bus 20.

The host I/F 21 outputs commands, user data (write data), and the like received from the host 4 onto the internal bus 20. The host I/F 21 transmits user data read from the nonvolatile memory 3, responses from the control unit 23, and the like to the host 4.

The memory I/F 22 controls writing user data and the like into the nonvolatile memory 3 and reading from the nonvolatile memory 3 based on instructions from the control unit 23.

The control unit 23 controls the storage device 1 across the board. The control unit 23 is, for example, a CPU (Central Processing Unit), MPU (Micro Processing Unit), or the like. When receiving a command from the host 4 via the host I/F 21, the control unit 23 performs control according to the command. For example, the control unit 23, according to a command from the host 4, instructs the memory I/F 22 to write user data and parity into the nonvolatile memory 3. Also, the control unit 23, according to a command from the host 4, instructs the memory I/F 22 to read user data and parity from the nonvolatile memory 3.

The control unit 23 determines a storage area (memory area) on the nonvolatile memory 3 for user data stored in the data buffer 27. User data is stored in the data buffer 27 via the internal bus 20. The control unit 23 performs the determination of the memory area for data in a page unit (page data), which is a write unit. In the present description, the memory cells connected in common to one word line are referred to as a memory cell group. Where the memory cell is a multi-level cell, the memory cell group corresponds to multiple pages. For example, where a multi-level cell capable of two-bit storage (two bits per cell) is used, the memory cell group corresponds to two pages. For example, where a multi-level cell capable of three-bit storage (three bits per cell) is used, the memory cell group corresponds to three pages. In the present description, user data to be written into one page is referred to as unit data.

The control unit 23 determines the memory area of the nonvolatile memory 3 for each unit data to be written into. Physical addresses are assigned to the memory areas of the nonvolatile memory 3. The control unit 23 manages memory areas for respective unit data to be written into with use of the physical addresses. The control unit 23 instructs the memory I/F 22 to write user data into the nonvolatile memory 3 with specifying the determined memory area (physical address). The control unit 23 manages the correspondence between logical addresses of user data (logical addresses managed by the host 4) and physical addresses. When receiving a read command including a logical address from the host 4, the control unit 23 identifies the physical address corresponding to the logical address and instructs the memory I/F 22 to read user data with specifying the physical address.

The assignment control unit 28 determines the way to assign data values to the plurality of threshold voltage areas of memory cells (hereinafter called a data value assigning scheme) when writing into the nonvolatile memory 3. The assignment control unit 28 instructs the memory I/F 22 to perform writing based on the determined assigning scheme. When reading from the nonvolatile memory 3, the assignment control unit 28 instructs the memory I/F 22 to read data with specifying the data value assigning scheme. The details of the data value assigning scheme of the present embodiment will be described later.

The ECC unit 24 comprises an encoding unit 25 and a decoding unit 26. The encoding unit 25 encodes first unit data to generate a first codeword. Further, the encoding unit 25 encodes second unit data to generate a second codeword. Although an example where data is encoded on a unit data basis will be described herein, the size of user data to be encoded is not limited to that of this example. A configuration where multiple codewords are written in one page is possible. Note that one codeword is written into the same page or the same memory cell group of the nonvolatile memory 3. The decoding unit 26 decodes a codeword read from the nonvolatile memory 3. Any scheme may be used for encoding, and, for example, RS code, BCH code, or LDPC code can be used. Further, in the present embodiment encoding is not essential, but user data without being encoded may be written into the nonvolatile memory 3. Note that determining the data value assigning scheme depending on whether error correction succeeded as described later, requires the premise that encoding is performed.

The data buffer 27 temporarily stores user data received from the host 4 until it is stored in the nonvolatile memory 3 and temporarily stores data read from the nonvolatile memory 3 until it is transmitted to the host 4. The data buffer 27 is constituted by, e.g., a general-purpose memory such as an SRAM (Static Random Access Memory) or a DRAM (Dynamic Random Access Memory).

In the NAND memory, a plurality of threshold voltage areas are defined with different data values being assigned to the areas respectively, and electrons are injected so that the threshold voltage of the memory cell is within the area corresponding to one of the data values. By this means, each memory cell can store a data value. In conventional NAND memories, the number of threshold voltage areas of the memory cell that are distinguishable is a power of two. Hereinafter, these are called multi-bit memory cells as needed. Hence, increasing the number of data values storable per memory cell from that of a memory cell capable of, e.g., three-bit storage per memory cell results in the use of a memory cell capable of four-bit storage. In this case, the number of areas increases greatly from 8 to 16. As the number of bits of data stored in a memory cell increases, this increment becomes greater.

Meanwhile, when the number of areas is increased, highly advanced technology for implementing in hardware is needed. Hence, for example, while it may be difficult to implement memory cells capable of four-bit storage, it may be possible to implement memory cells of which the number of areas is greater than 8 and less than 16. In this case, if the number of areas is limited to a power of two, these memory cells can be used merely as being of three bits per cell, not otherwise. Accordingly, if data can be stored using a number, not being a power of two, of areas, then a number of areas that can be implemented in hardware can be utilized sufficiently.

As an example of using the number of areas which is not a power of two, there is a base-k numeral system to represent data values, where k is an integer larger than 2. For example, if the number of areas is 9, the base-3 numeral system is suitable to use all areas without any loss. However, since other information devices use binary numbers and it is different from conventional control under the premise that binary numbers are used, conventional processing cannot be used, resulting in processing being complex. With the storage device in the present embodiment (hereinafter called a fractional-bit memory cell as needed), even when the number of areas is not a power of two, binary numbers are used, while aiming at effective utilization of all the areas. Specifically, areas not used for writing of memory cells already written into are used to reduce the number of erasure times.

As a method of maximizing the number of times when overwriting can be performed without erasure operation, flash code (floating code) for write once memories is known. These code are used for multi-bit memory cells in most cases. With fractional-bit memory cells, the case where the number of distinguishable areas is not a power of two is dealt with. Because the flash code maximizes the number of times when overwriting can be performed without erasure, the flash code does not match an error-correcting code well. With fractional-bit memory cells, by adopting simple value assignment completed on a cell basis, any error-correcting code can be used for data in a page as in the usual case where overwriting is not considered.

Figure 2:
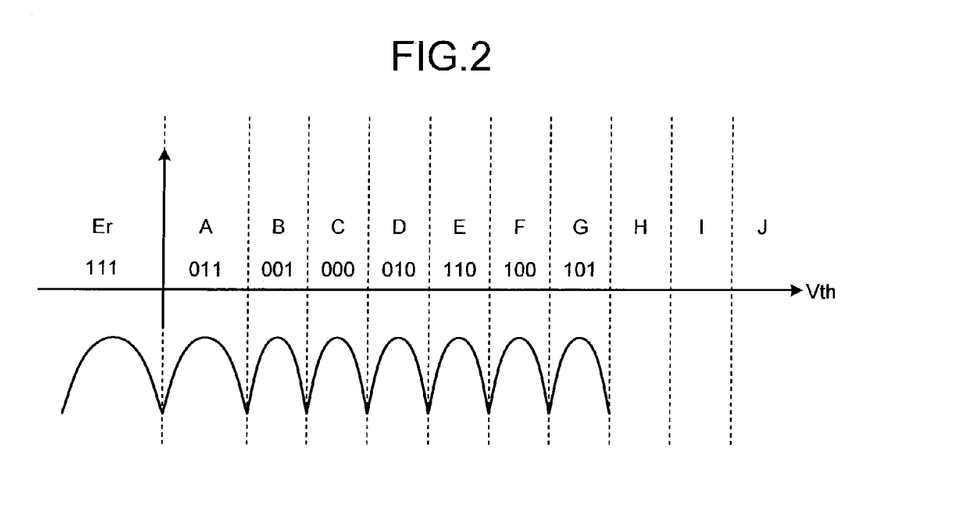
FIG. 2 is a graph showing an example of correspondence between the threshold voltages Vth of a cell and three-bit data values before overwritten.

Next, data value assignment in the present embodiment will be described. In the present embodiment, an example where three-bit writing is performed using eight areas and where thereafter two-bit overwriting is performed using four areas will be described. Here, 11 threshold voltage areas can be used. FIG. 2 is a graph showing an example of correspondence between the threshold voltages Vth of a cell and three-bit data values before overwritten. In this specification, writing into a memory cell which is not yet written into or has not been written into since erasure is called initial writing (first writing), and further writing into a memory cell on which initial writing has been performed is called overwriting (second writing). In the initial writing, a data value is set to correspond to each area by data value assignment using eight areas (first data value assignment) as illustrated in FIG. 2. Mountain shapes depicted in the lower part of FIG. 2 represent conceptual threshold voltage distributions. For these mountain shapes, the horizontal axis represents the threshold voltage value, and the vertical axis represents the number of cells having the threshold voltage. The mountain shapes depicted in the lower part of FIG. 2 represent conceptual ones, and actual threshold voltage distributions may not be in mountain shapes of FIG. 2.

The memory cells of the nonvolatile memory 3 of the present embodiment are ones in which 11 areas Er, A, B, C, D, E, F, G, H, I, J divided by dotted lines in FIG. 2 are usable. When a memory cell which is not yet written into or has not been written into since erasure is written into, that is, in initial writing, eight areas Er, A, B, C, D, E, F, G are set to correspond to three-bit data values "111", "011", "001", "000", "010", "110", "100", "101" respectively as shown in FIG. 2. In writing, electrons are injected so that the threshold voltage of the memory cell is within the area corresponding to the data value to be written. In reading, by applying threshold voltages (indicated by dotted lines in FIG. 2) that are at the boundaries between the areas to the memory cell, the data value stored in the memory cell can be read. As the method of reading three bits per cell, although any method can be used, there are, for example, a method in which a read threshold voltage (read voltage) is determined for each bit to read each bit using the read voltage corresponding to the bit, and so on. As seen from FIG. 2, in initial writing, a data value is not assigned to the areas H, I, J. The data value assignment of FIG. 2 is an example, and three-bit data value assignment to the areas Er, A, B, C, D, E, F, G is not limited to the example of FIG. 2.

Figure 3:
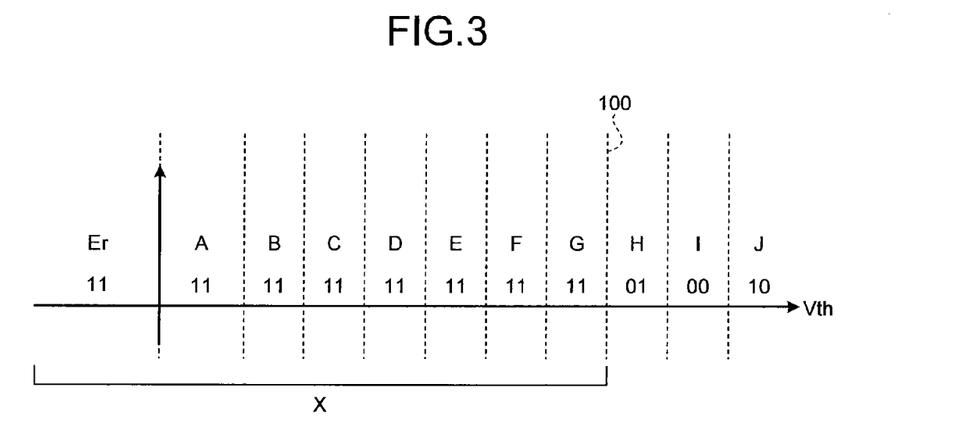
FIG. 3 is a diagram showing an example of correspondence between the threshold voltage areas and data values in overwriting.

FIG. 3 is a diagram showing an example of correspondence between the threshold voltage areas and data values in overwriting. FIG. 3 shows an example where, after initial writing is performed conforming to the data value assignment of FIG. 2, overwriting with two-bit data is performed. As shown in FIG. 3, regarding the eight areas already written into as one large area (combined area) X, the four of the area X and the areas H, I, J are used to correspond to the four data values of two bits respectively. As such, in overwriting, data values are set to correspond to the areas by data value assignment (second data value assignment) using the threshold voltage areas not used in the first data value assignment. In the example of FIG. 3, "11" is set to correspond to the area X, and "01" is set to correspond to the area H. In overwriting with "11", erasure need not be performed on a memory cell on which initial writing has been performed, and additional charge injection need not be performed either. If charge is injected in order to reduce the difference in charge amount from an adjacent cell or so on, the charge is limited so that the threshold voltage is within the area X. In contrast, in overwriting with "01", additional charge is injected into a memory cell on which initial writing has been performed, without erasing, so that the threshold voltage is within the area H. Thus, the memory cell having "01" overwritten therein has a threshold voltage within the area H.

In reading, by applying the threshold voltages that are at the boundaries between the area X and the area H, the area H and the area I, and the area I and the area J, the data value overwritten in the memory cell can be read. Because the data value written in initial writing cannot be restored after overwritten, overwriting is performed on memory cells storing data that has become unnecessary.

Figure 4:
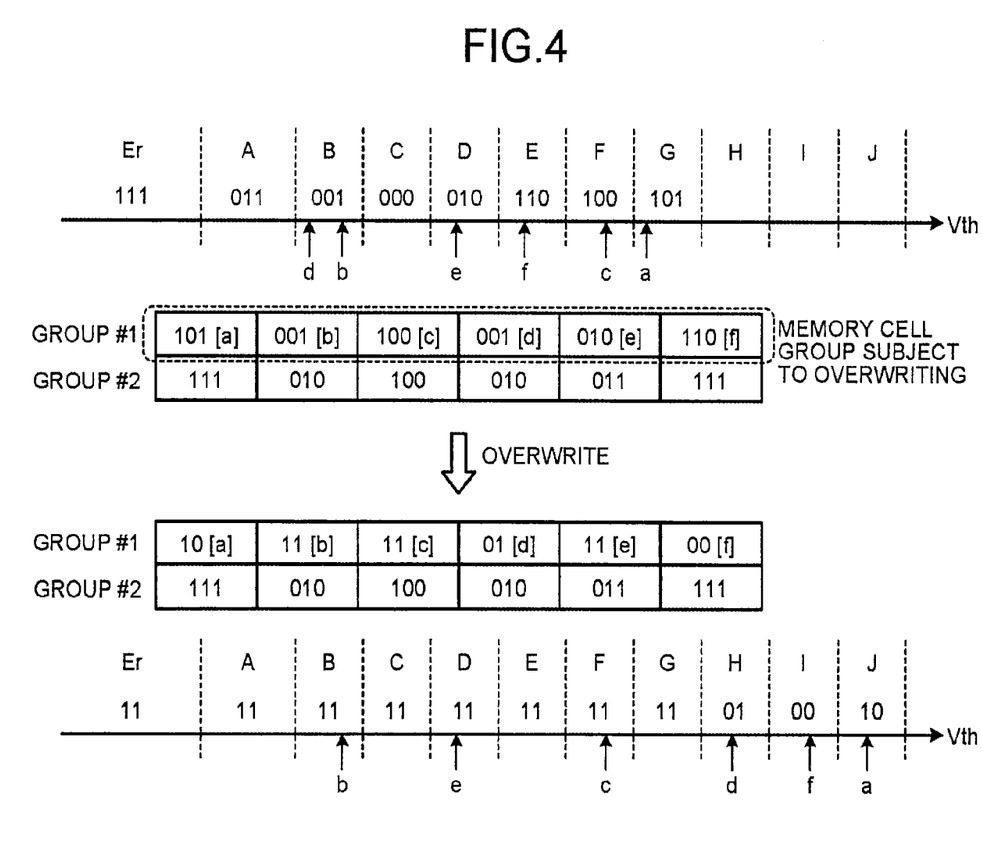
FIG. 4 is a diagram showing an example of the threshold voltages of memory cells and data to be stored where the data value assignment of FIGS. 2, 3 is used.

Next, a specific example of overwriting will be described. FIG. 4 is a diagram showing an example of the threshold voltages of memory cells and data to be stored where the data value assignment of FIGS. 2, 3 is used. Here, for simplicity, an example where one memory cell group consists of six memory cells will be described. FIG. 4 shows two memory cell groups, group #1 and group #2. It is supposed that of these groups, memory cell group #1 is subject to overwriting. The memory cells forming this memory cell group are indicated by a, b, c, d, e, f in the figure from left in that order. It is supposed that data values of "101", "001", "100", "001", "010" and "110" are written in a, b, c, d, e and f, respectively due to initial writing. In FIG. 4, expressions "101[a]", etc., indicate that "101" is written in memory cell a. "101[a]", etc., in the upper part of FIG. 4 denote data stored in their respective memory cells before overwritten. Above these, the threshold voltages that the memory cells have are indicated by arrows and memory cell names (a, b, . . . ). For example, memory cell a stores a data value of "101", and hence the threshold voltage of memory cell a is within the area G corresponding to "101".

Where data stored in the memory cell group consisting of memory cells a, b, c, d, e, f has become unnecessary, overwriting is performed on this memory cell group. "10[a]", etc., below the solid white arrow labelled overwriting denote data values to overwrite with. In overwriting, as described using FIG. 3, charge need not be injected into memory cells which the data value to be overwritten into is "11". In contrast, as to memory cells which the data values to be overwritten into are "01", "00", "10", charge is injected into them so that their threshold voltages are within the areas H, I, J. In the lowest part of FIG. 4, the positions of the threshold voltages of the memory cells after overwriting are indicated by arrows and memory cell names. These changes in charge amount that make the threshold voltages be within the areas H, I, J can be realized by a change in one direction that is an increase in charge amount. In the example of FIG. 4, as to memory cells b, c, e, the data value to be overwritten into them is "11", and hence charge is not injected, so that the threshold voltages do not change from the values before overwriting. In contrast, as to memory cells a, d, f, the data values to be overwritten into them are not "11", and hence charge is injected, so that the threshold voltages move into areas not used before overwriting.

Figure 5:
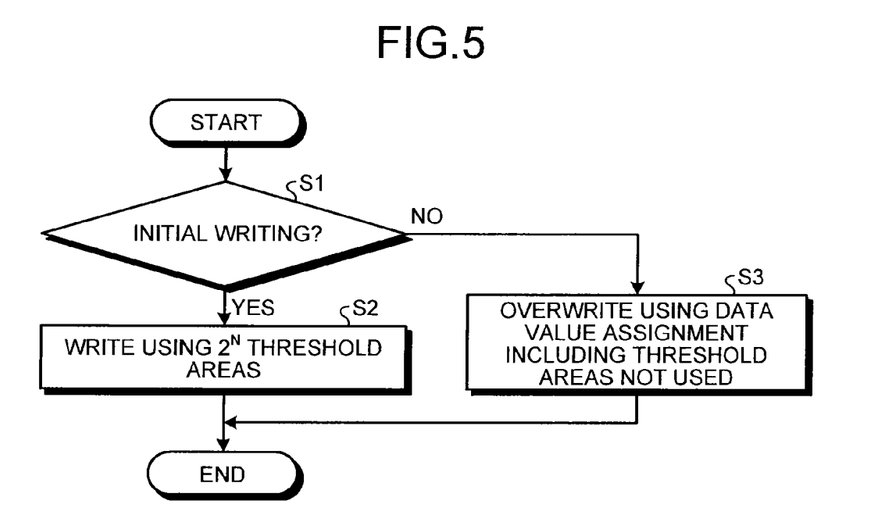
FIG. 5 is a chart showing an example of the write procedure of the first embodiment.

Next, the write and read operations of the present embodiment will be described. FIG. 5 is a chart showing an example of the write procedure of the present embodiment. When a write request is transmitted from the host 4, the control unit 23 determines a memory area on the nonvolatile memory 3 into which to write first or second unit data created based on user data received from the host 4. When user data is encoded and written into the nonvolatile memory 3, one codeword is written in the same page or the same memory cell group as mentioned above. Thus, determining the write destination for the first or second unit data corresponds to determining the write destination for its codeword. Further, the control unit 23 determines whether writing is to be performed by initial writing or by overwriting. A method of determining this write mode will be described later. The control unit 23 instructs the assignment control unit 28 whether to write by initial writing or by overwriting, for each unit data.

The assignment control unit 28 determines whether to perform initial writing, based on the instruction from the control unit 23 (step S1). If determining to perform initial writing (Yes at step S1), the assignment control unit 28 writes into the nonvolatile memory 3 using $2^n$ threshold voltage areas, where n is an integer, as illustrated in FIG. 2 (step S2). Specifically, the assignment control unit 28 instructs the memory I/F 22 to write using $2^n$ threshold voltage areas. The memory I/F 22 instructs the nonvolatile memory 3 to write data, with notifying the address specifying the memory group to write data into and information designating initial writing as the write mode to the nonvolatile memory 3. The nonvolatile memory 3 performs writing according to the instruction from the memory I/F 22. Although FIG. 2 illustrates the case where n is three, n can be one or greater.

On the other hand, if determining to write by overwriting, not initial writing (No at step S1), the assignment control unit 28 writes into the nonvolatile memory 3 using the data value assignment using the areas not used in data value assignment of initial writing as illustrated in FIG. 3 (step S3).

The write procedure described above is executed for each user data to be written (i.e., for each page). Although the minimum unit for deciding on the write mode is the page, the write mode may be decided on for each block unit that is a unit for erasure, not for each page unit. One block consists of multiple memory cell groups.

Next, the read operation of the present embodiment will be described. In reading, it is necessary to determine whether data to be read was written by initial writing or by overwriting. This determination of the write mode may be performed using any method, of which four examples (A), (B), (C), (D) are shown below. These methods can be used together.

(A) Method which Uses a Page for which there is Only One Type of Write Mode

Suppose the premise that a page exists for which the write mode is fixed at one type or only one type exists in nature. Write mode information is recorded in the single-write-mode page. Before a necessary page is read, the single-write-mode page storing write mode information of that page is read to determine the write mode of the necessary page. As a specific example of this method, the following method is conceivable. The write mode information is added to the physical address of the nonvolatile memory 3 (a NAND memory) corresponding to a logical address from the host. When the physical address of the nonvolatile memory 3 is recorded in the nonvolatile memory 3, single-level cells to record one bit therein are used.

(B) Method which Records the Write Mode in a Memory Cell Group

One cell or some cells, as needed, in a memory cell group are used to record write mode information, not to record information of the host. For example, in the case of FIG. 4, charge is injected into a write-mode information recording cell in such an amount as to fall into the smallest area Er of the areas Er, A, B, C, D, E, F, G, to which data values are assigned for initial writing. Then applying any voltage used in reading following initial writing does not cause current to flow in the write-mode information recording cell. In contrast, if charge is injected into the write-mode information recording cell in such an amount as to fall into the largest area G, then applying any voltage used in reading following initial writing causes current to flow in the write-mode information recording cell. Thus, by injecting one of the two amounts of charge into the write-mode information recording cell, on and off can be distinguished regardless of the type of page to be read that is subjected to initial writing. For example, when a voltage used in reading from a page subjected to initial writing is applied, if current in the write-mode information recording cell is off, then the write mode can be determined to be overwriting, not initial writing and, if on, determined to be initial writing. The correspondence between on or off of current and initial writing or not may be the opposite. This determining method is used under the premise that the reading is reading following initial writing, and if a voltage used in reading following overwriting is applied, current is off for both the above two charge-injected states, so that they do not work for write-mode determination. Hence, even if the write mode is not certain but expected to be overwriting, first the on or off of current of the write-mode information recording cell needs to be examined with a voltage in the initial-writing areas for write-mode determination. Then, when it is ascertained that it is overwriting, reading following overwriting is performed anew.

In order to enable determination by reading following overwriting as well, another write-mode information recording cell should be prepared. As above, charge is injected into the write-mode information recording cell in an amount corresponding to the smallest areas Er to G of the areas to which data values are assigned for overwriting. Then applying any voltage used in reading following overwriting does not cause current to flow in the write-mode information recording cell. In contrast, when charge is injected into the write-mode information recording cell in an amount corresponding to the largest area J, applying any voltage used in reading following overwriting causes current to flow in the write-mode information recording cell. Thus, if current in the write-mode information recording cell for overwriting determination is off, then the write mode can be determined to be not overwriting and, if on, determined to be overwriting. Where a plurality of times of overwriting are possible, if one write-mode information recording cell is used to deal with them, it can be managed by increasing the number of values that can be taken on, and if reading for any write mode is to be dealt with, it can be managed by increasing the number of write-mode information recording cells.

(C) Method which Uses Statistic Information of Pages

Suppose the prior condition that in a page the number of 0s and the number of is are almost half and half. If a module called a randomizer (scrambler) is provided in the memory controller, this condition will be met. It depends on the configuration of the randomizer to what degree the numbers are close to half, and it needs to be realized that to what degree the numbers are away from half with respect to the number of bits constituting the page. For example, let $\delta$% be the permissible deviation from 50%. It is set to such a value that if trial was conducted a guaranteed number of writing times, the deviation would occur only at, for example, 1e-6 which depends on required reliability of a storage product. With using another determining method together, the value of $\delta$ may be set relatively large. In general, because the number of bits constituting a page is usually one hundred thousand or greater, $\delta$ is expected to be sufficiently small from a central limit theorem. Although in the above the influence of errors is not considered, if errors occur symmetrically for bit values 0 and 1, there is no problem. Even with asymmetrical errors, if the number of erroneous bits is within several percent, the method described below can be used in most cases.

Suppose, for example, the case of FIG. 4 to be true. First, consider the case of using the boundary between the areas used in initial writing and the areas used in overwriting, that is, the boundary between the areas G and H for write-mode determination. Since, in initial writing, the areas H, I, J are not used, the number of cells in which current flows is nearly zero. In contrast, in overwriting, four values of two-bit data each occur at a rate of $\{(50\pm\delta)/100\}^2$, and hence the number of cells in which current flows is $3\times\{(50\pm\delta)/100\}^2\times$(the number of bits constituting the page). Thus, if smaller than $3\times\{(50-\delta)/100\}^2\times$(the number of bits constituting the page), the write mode can be determined to be initial writing and, if greater than or equal to that, determined to be overwriting. Where extreme asymmetrical errors do not occur in large numbers, since the number of bits constituting the page is large, δ is small, and thus the cells will be separated into two groups, a group of a small number of cells, which number can be regarded as almost zero as compared with the number of bits constituting the page, and a group of a number of cells, which number is about ¾ of the number of bits constituting the page.

The above threshold voltage determination for write-mode determination is also an operation necessary to read a high-order bit following overwriting. If the threshold voltage determination is performed also with the boundary between the areas I and J, a high-order bit overwritten can be identified. Thus, if the write mode is overwriting, while reading, write-mode determination can be performed at the same time. In contrast, if it is found out by write-mode determination that the write mode is initial writing, then the reading process needs to be performed from the beginning. For example, in the case of FIG. 4, the threshold voltage determination needs to be performed further twice with the boundary between the areas Er and A and the boundary between the areas D and E, which are necessary to read the highest-order bit following initial writing. Thus, if the write mode is not overwriting, write-mode determination cannot form part of reading.

While in the above specific example, write-mode determination can form part of reading if the write mode is overwriting, it is also possible to make write-mode determination form part of reading in the case of initial writing. To this end, the case of performing the threshold voltage determination for write-mode determination with the boundary between the areas D and E is considered. If the write mode is initial writing, the areas Er to G are used, and hence the three areas E, F, G are higher than the determination voltage, so that current flows in about ⅜ of cells constituting the page. If the write mode is overwriting, current flows in ¾ or greater, including cells charged to the three areas H, I, J and the areas E, F, G in initial writing before, of the cells. Because the difference between the two is a large number, (the number of bits constituting the page)×⅜, this threshold voltage determination can be used for write-mode determination. The write-mode determination and the threshold voltage determination necessary to read the highest-order bit following initial writing are the same. Meanwhile, the write-mode determination and the threshold voltage determination necessary to read a high-order bit following overwriting do not have a common point. As such, the threshold voltage determination for write-mode determination and the threshold voltage determination necessary to read are made the same for one of the two write modes. Therefore, the following use is possible. If it is expected from the data storing status in reading a high-order bit that the write mode is initial writing, the read voltage for write-mode determination is made to coincide with a value necessary to read a high-order, bit following initial writing, and if it is expected to be overwriting, the read voltage is made to coincide with a value necessary to read a high-order bit following overwriting.

(D) Determining Method which Uses Different Error-Correcting Codes

When unit data is encoded and stored in the nonvolatile memory 3, different error-correcting codes are used for initial writing and overwriting. The error correction process corresponding to the error-correcting code (first error-correcting code) for initial writing is referred to as a first error correction process, and the error correction process corresponding to the error-correcting code (second error-correcting code) for overwriting is referred to as a second error correction process. After data is read, the decoding unit 26 performs the first or second error correction process. If the error correction process performed by the decoding unit 26 does not correspond to the write mode, decoding will fail. By this means, the write mode of each page can be determined. For example, if, with the area H being wide, the reliability of one bit after overwriting is high, an error-correcting code lower in error correction capability than that in initial writing can be used in overwriting. Another example is the case where it is desired to make the difference between codes of the two write modes as small as possible. In this case, for example, a QC-LDPC (Quasi-Cyclic Low Density Parity Check) code is used. The feature of this code is that a check matrix is divided on a per block basis and that each block is characterized by shift values from a unit matrix. Thus, by making the shift values slightly different only for several blocks, the difference between the first error-correcting code and the second error-correcting code can be suppressed to a minimum.

Figure 6:
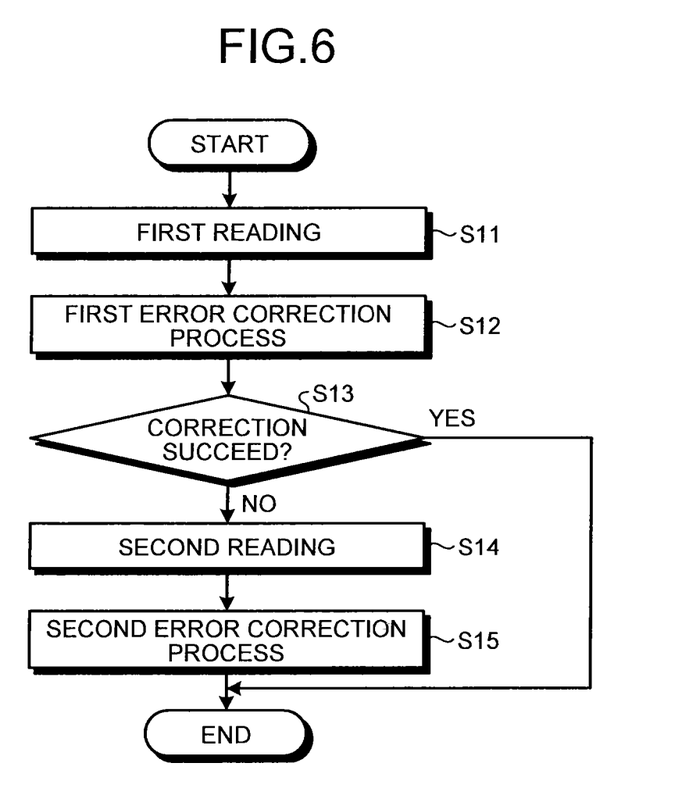
FIG. 6 is a chart showing an example of the read procedure in the case of using a determining method which uses different error-correcting codes.

FIG. 6 is a chart showing an example of the read procedure in the case of using the determining method which uses different error-correcting codes (method (D)). First, the assignment control unit 28 performs reading (first reading) based on the first data value assignment (step S11). Then the decoding unit 26 performs the first error correction process on the read codeword (step S12). The decoding unit 26 notifies whether error correction by the first error correction process succeeded to the assignment control unit 28. The assignment control unit 28 determines whether the error correction succeeded, based on the notification (step S13), and if the error correction succeeded (Yes at step S13), the process ends.

If the error correction failed (No at step S13), reading based on the second data value assignment (second reading) is performed on the memory cell group on which reading was performed at step S11 (step S14). Then the decoding unit 26 performs the second error correction process on the read codeword (step S15), and the process ends. Although the error correction by the second error correction process may also fail, in this case, errors occur in numbers beyond the error correction capability, and hence the process of notifying the host 4 of error correction being impossible or so on is performed.

Although in the present embodiment an example where the number of threshold voltage areas of memory cells is eleven has been described, the number of threshold voltage areas of memory cells is not limited to this.

Second Embodiment

Figure 7:
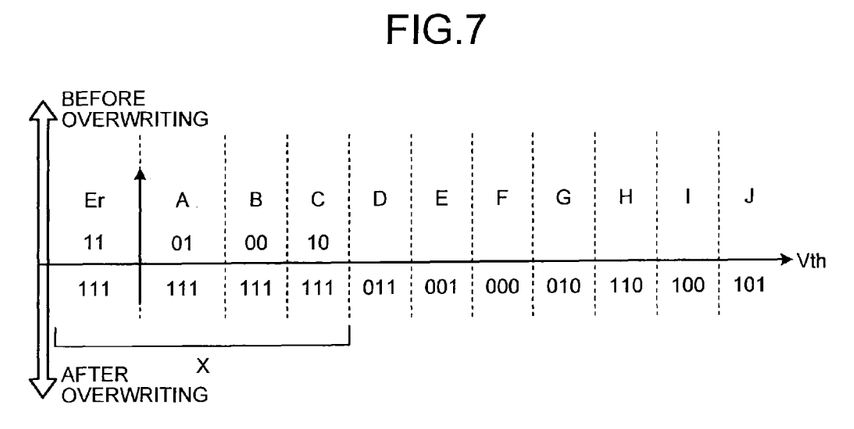
FIG. 7 is a diagram showing an example of the data value assignment in overwriting of a second embodiment.

FIG. 7 is a diagram showing an example of the data value assignment in overwriting of the second embodiment. The configuration of a semiconductor storage device 1 of the present embodiment is the same as in the first embodiment. Differences from the first embodiment will be described below.

While the first embodiment describes the case where the number of areas is large in initial writing, in the present embodiment an example where the number of areas is large in overwriting will be described.

FIG. 7 shows an example where 11 areas Er, A, B, C, D, E, F, G, H, I, J can be set in memory cells as in the first embodiment. In initial writing, writing is performed conforming to data value assignment (first data value assignment) using four areas (areas Er, A, B, C) as in the first embodiment. Seven areas (areas D, E, F, G, H, I, J) on the higher voltage side are not used in the first data value assignment. Data assignment for two bits in initial writing is the same as data assignment in overwriting in the first embodiment.

In overwriting in the present embodiment, the four areas already written into are regarded as a large area X. Then, overwriting is performed conforming to three-bit data value assignment (second data value assignment) using eight areas, the area X and the seven areas not used in the first data value assignment. As shown in the lower part of FIG. 7, data assignment for three bits in overwriting is the same as data assignment in initial writing in the first embodiment.

When overwriting with "111", charge need not be injected, and hence the cell may remain in the initial written state. When overwriting with a value other than "111", charge is injected so that threshold voltage of the memory cell falls into the area corresponding to the value to be overwritten with. When reading from memory cells overwritten into, reading is performed based on the three-bit data value assignment (second data value assignment) in overwriting. The operation of the present embodiment except for the above is the same as in the first embodiment.

Although in the present embodiment an example where the number of threshold voltage areas of memory cells is eleven has been described, the number of threshold voltage areas of memory cells is not limited to this. Further, the first embodiment and the present embodiment may be used together as needed.

Third Embodiment

Figure 8:
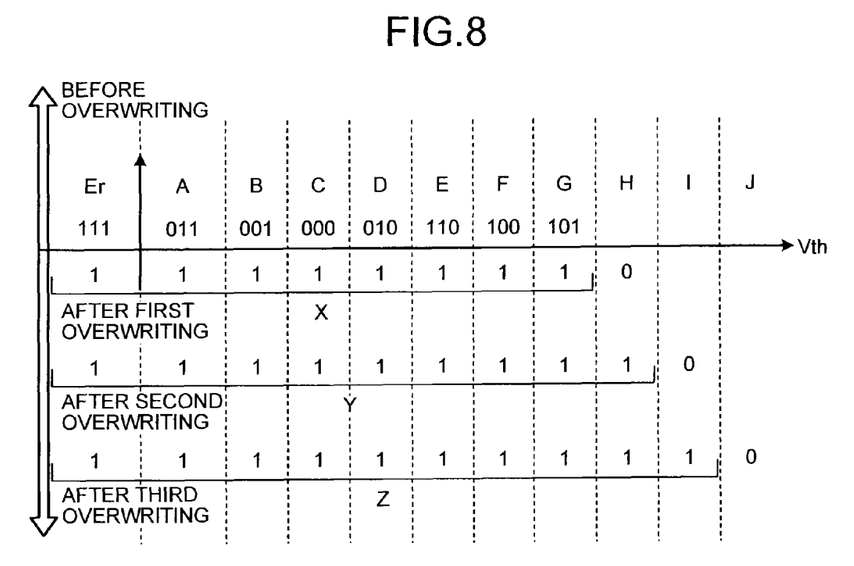
FIG. 8 is a diagram showing an example of the data value assignment in overwriting of a third embodiment.

FIG. 8 is a diagram showing an example of the data value assignment in overwriting of the third embodiment. The configuration of a semiconductor storage device 1 of the present embodiment is the same as in the first embodiment. Differences from the first embodiment will be described below.

In the present embodiment, as in the second embodiment, an example where ($2^n$+3) number of threshold voltage areas can be set in memory cells of the nonvolatile memory 3 and an example where ($2^n$+2) number of threshold voltage areas can be set will be described.

FIG. 8 shows an example where memory cells of the nonvolatile memory 3 have 11 threshold voltage areas that is, 11 areas Er, A, B, C, D, E, F, G, H, I, J can be set in memory cells. In initial writing, writing is performed conforming to data value assignment (first data value assignment) using eight areas (areas Er, A, B, C, D, E, F, G) as in the first embodiment. Three areas (areas H, I, J) on the higher voltage side are not used in the first data value assignment.

In overwriting in the present embodiment, the eight areas already written into are regarded as a large area X. Then, first time overwriting (first overwriting) is performed conforming to one-bit data value assignment (second data value assignment) using the area X and the area H, one of the three areas not used in the first data value assignment.

Further, with memory cells after the first time overwriting, nine areas (Er, A, B, C, D, E, F, G, H) used in the first overwriting and earlier are regarded as a large area Y. Then, second time overwriting (second overwriting) is performed conforming to one-bit data value assignment (third data value assignment) using the area Y and the area I, one of the two areas not used in the first overwriting and earlier.

Yet further, with memory cells after the second time overwriting, ten areas (Er, A, B, C, D, E, F, G, H, I) used in the second overwriting and earlier are regarded as a large area Z. Then, third time overwriting (third overwriting) is performed conforming to one-bit data value assignment (fourth data value assignment) using the area Z and the area J not used in the second overwriting and earlier.

In this way, one-bit overwriting can be performed up to a total of three times. In reading from memory cells overwritten into, it is determined whether the write mode is initial writing, first, second, or third overwriting, and reading according to the write mode is performed based on the determining result.

Although the write mode determining method is the same as in the first embodiment, not only initial writing or overwriting but also the type of overwriting (first, second, or third overwriting) needs to be determined. Thus, for example, in the case of using the determining method (D) of the first embodiment, different error-correcting codes are used for first, second, and third overwriting respectively. In the case of using the determining method (C), for example, the following procedure is used. First, whether it is third overwriting is determined by determining with a read voltage at the boundary between the areas I and J. If not third overwriting, then whether it is second overwriting is determined by determining with a read voltage at the boundary between the areas H and I. If not second overwriting, then whether it is first overwriting is determined by determining with a read voltage at the boundary between the areas G and H. The operation of the present embodiment except for the above is the same as in the first embodiment.

In the present embodiment, as to up to three times of overwriting, the number of bits is one, the same for each overwriting time, but the number of bits may be different for each overwriting time. Further, as needed, the number of rewrite times until erasure may be changed as the number of bits in each writing time may be changed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a nonvolatile memory having multiple memory cells that can store data by having a set threshold voltage thereof included in one of threshold areas divided according to multiple read voltages; and
a memory controller configured to perform reading and writing data from and into the nonvolatile memory,
wherein a number, not being a power of two, of the threshold areas can be set in the memory cells,
wherein the memory controller performs first writing based on first data value assignment, which sets a power of two of data values to correspond respectively to a power of two of threshold areas, in first-time writing into a first memory cell of the nonvolatile memory and performs second writing on the first memory cell on which writing was performed by the first writing without erasing data written in the first writing based on second data value assignment, which sets a power of two of data values to correspond respectively to a power of two of threshold areas including threshold areas not used in the first data value assignment, and
wherein taking the power of two of threshold areas used in the first data value assignment as a first combined area, in the second data value assignment, the first combined area and the threshold areas not used in the first data value assignment are set to correspond to the power of two of data values.

2. The storage device according to claim 1, wherein a power of two plus one of threshold areas can be set in the memory cells, and in the second data value assignment, the first combined area and one threshold area not used in the first data value assignment are set to correspond to 1-bit data values respectively.

3. The storage device according to claim 1, wherein a power of two plus two of threshold areas can be set in the memory cells, and in the second data value assignment, the first combined area and one threshold area not used in the first data value assignment are set to correspond to 1-bit data values, and wherein the memory controller performs third writing on the first memory cell on which writing was performed by the second writing without erasing data written in the second writing based on third data value assignment, which, taking the threshold areas used in the second data value assignment as a second combined area, sets the second combined area and one threshold area not used in the second data value assignment to correspond to 1-bit data values respectively.

4. The storage device according to claim 1, wherein a power of two plus three of threshold areas can be set in the memory cells, and in the second data value assignment, the first combined area and one threshold area not used in the first data value assignment are set to correspond to 1-bit data values, and wherein the memory controller performs third writing on the first memory cell on which writing was performed by the second writing without erasing data written in the second writing based on third data value assignment, which, taking the threshold areas used in the second data value assignment as a second combined area, sets the second combined area and one threshold area not used in the second data value assignment to correspond to 1-bit data values respectively, and performs fourth writing based on fourth data value assignment, which, taking the threshold areas used in the third data value assignment as a third combined area, sets the third combined area and one threshold area not used in the third data value assignment to correspond to 1-bit data values respectively.

5. The storage device according to claim 1, wherein a power of two plus three of threshold areas can be set in the memory cells, and in the second data value assignment, the first combined area and three threshold areas not used in the first data value assignment are set to correspond to 2-bit data values respectively.

6. The storage device according to claim 1, wherein a power of two plus seven of threshold areas can be set in the memory cells, and in the second data value assignment, the first combined area and seven threshold areas not used in the first data value assignment are set to correspond to 3-bit data values respectively.

7. The storage device according to claim 1, wherein when reading data written in the second writing, the memory controller determines that the read data is of a first value if the threshold voltage of the memory cell is determined to be in the threshold areas used in the first data value assignment and determines that the read data is of a second value if the threshold voltage of the memory cell is determined to be in the threshold areas used for the first time in the second data value assignment.

8. The storage device according to claim 1, wherein two to the power of the integer of threshold areas used in the first data value assignment are two to the power of the integer of threshold areas selected in the order of from low threshold voltage from among threshold areas that can be set in the memory cells.

9. The storage device according to claim 1, wherein in the second writing, when writing one value corresponding to the threshold areas used in the first writing, charge is not injected anew.

10. The storage device according to claim 1, wherein in the second writing, when writing one value corresponding to the threshold areas used in the first writing, charge is injected in such an amount as to fall into the threshold areas used in the first writing, with understanding a value written in the first writing in order to reduce charge unevenness.

11. The storage device according to claim 1, wherein information with which to determine what number time the writing is, is recorded in a storage area having only one type of writing in the storage device.

12. The storage device according to claim 1, wherein information with which to determine what number time the writing is, is recorded in a storage area having multiple types of writing in the storage device.

13. The storage device according to claim 1, wherein with unevenness in probability of a data value to be written between data values being eliminated, the memory controller totals data values in a write unit, which is written at a time into the storage device, read from the storage device and determines what number time the writing is based on the total and difference in occurrence frequency of data values according to the number of unused threshold areas.

14. The storage device according to claim 1, wherein an error-correcting code different according to what number time the writing is, is used.

15. A memory controller which performs reading and writing data from and into a nonvolatile memory having multiple memory cells that can store data by having a set threshold voltage thereof included in one of threshold areas divided according to multiple read voltages, the memory controller comprising:

an assignment control unit configured to perform first writing based on first data value assignment, which sets a power of two of data values to correspond respectively to a power of two of threshold areas, in first-time writing into a first memory cell of the nonvolatile memory and performs second writing on the first memory cell on which writing was performed by the first writing without erasing data written in the first writing based on second data value assignment, which sets a power of two of data values to correspond respectively to a power of two of threshold areas including threshold areas not used in the first data value assignment, wherein a number, not being a power of two, of the threshold areas can be set in the memory cells, and wherein the control unit, taking the power of two of threshold areas used in the first data value assignment as a first combined area, in the second data value assignment, the first combined area and the threshold areas not used in the first data value assignment are set to correspond to the power of two of data values.

16. A memory control method which performs reading and writing data from and into a nonvolatile memory having multiple memory cells that can store data by having a set threshold voltage thereof included in one of threshold areas divided according to multiple read voltages, the memory controller comprising:

performing first writing based on first data value assignment, which sets a power of two of data values to correspond respectively to a power of two of threshold areas, in first-time writing into a first memory cell of the nonvolatile memory; and performing second writing on the first memory cell on which writing was performed by the first writing without erasing data written in the first writing based on second data value assignment, which sets a power of two of data values to correspond respectively to a power of two of threshold areas including threshold areas not used in the first data value assignment, wherein taking the power of two of threshold areas used in the first data value assignment as a first combined area, in the second data value assignment, the first combined area and the threshold areas not used in the first data value assignment are set to correspond to the power of two of data values, and a number, not being a power of two, of the threshold areas can be set in the memory cells.

\* \* \* \* \*